United States Patent [19]
Yukawa et al.

[11] Patent Number: 5,306,898
[45] Date of Patent: Apr. 26, 1994

[54] HEATER FOR SHEET MATERIAL

[75] Inventors: Shinya Yukawa; Shingo Ooyama; Fumiaki Tagashira; Shigeo Ota, all of Kyoto, Japan

[73] Assignee: Rohm Co., Ltd., Kyoto, Japan

[21] Appl. No.: 993,676

[22] Filed: Dec. 21, 1992

[30] Foreign Application Priority Data

Dec. 28, 1991 [JP] Japan .................. 3-359322
Dec. 28, 1991 [JP] Japan .................. 3-359323
Dec. 28, 1991 [JP] Japan .................. 3-359326

[51] Int. Cl.$^5$ .......................... H05B 3/16
[52] U.S. Cl. ..................... 219/543; 219/216; 355/290; 338/308
[58] Field of Search ............. 219/216, 543; 355/285, 355/289, 290; 338/279, 280, 307, 308, 309

[56] References Cited

U.S. PATENT DOCUMENTS

| | | | |
|---|---|---|---|
| 2,606,987 | 8/1952 | Winstead | 219/543 |
| 4,626,664 | 12/1986 | Grise | 219/543 |
| 5,041,718 | 8/1991 | d'Hondt et al. | 219/216 |
| 5,068,517 | 11/1991 | Tsuyuki et al. | 219/216 |
| 5,083,168 | 1/1992 | Kusaka et al. | 219/216 |

FOREIGN PATENT DOCUMENTS

| | | | |
|---|---|---|---|
| 0426072 | 5/1991 | European Pat. Off. | 355/290 |
| 3-150584 | 6/1991 | Japan. | |

Primary Examiner—Bruce A. Reynolds
Assistant Examiner—Gregory Mills
Attorney, Agent, or Firm—William H. Eilberg

[57] ABSTRACT

A heater for a sheet material comprises an insulating substrate and a main resistor strip formed on the substrate. The substrate is further formed with auxiliary resistor strips adjacent to both ends of the main resistor strip. In operation, the main and auxiliary resistor strips are actuated simultaneously for heat generation. As a result, the additional heat generated by the auxiliary resistor strips compensates for higher heat dissipation at both ends of the heater, thereby equalizing the temperature distribution longitudinally of the heater.

11 Claims, 10 Drawing Sheets

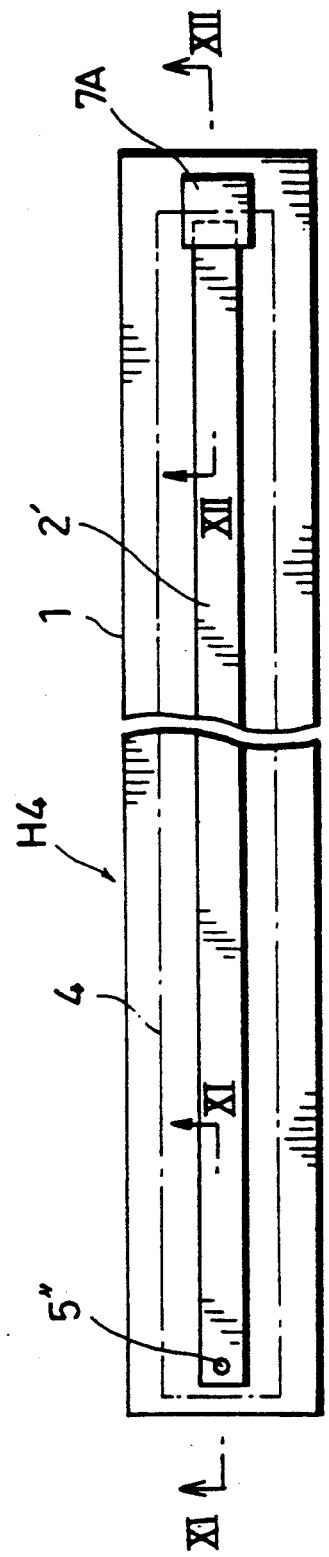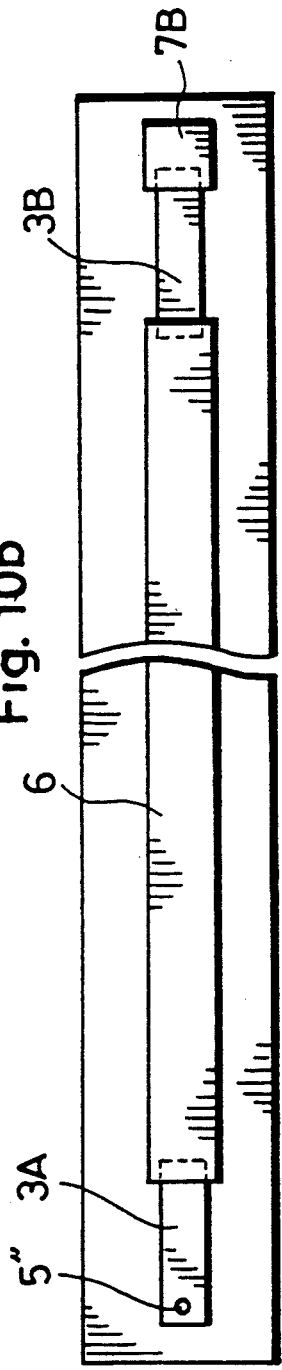

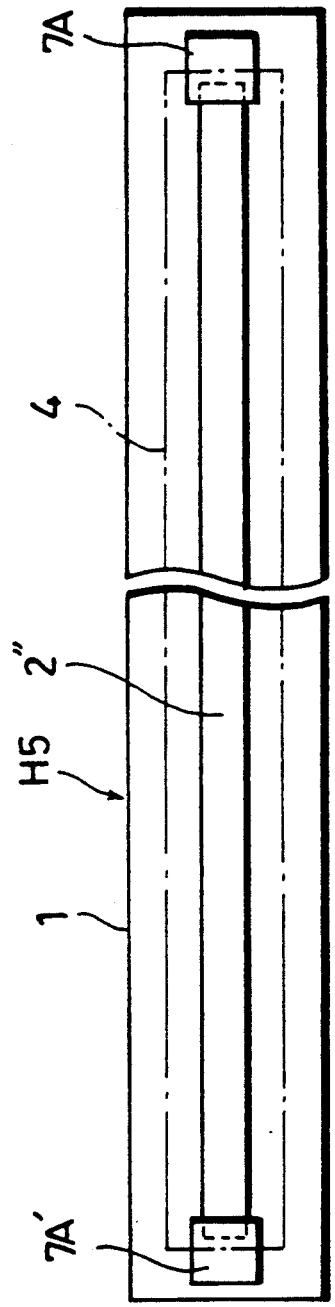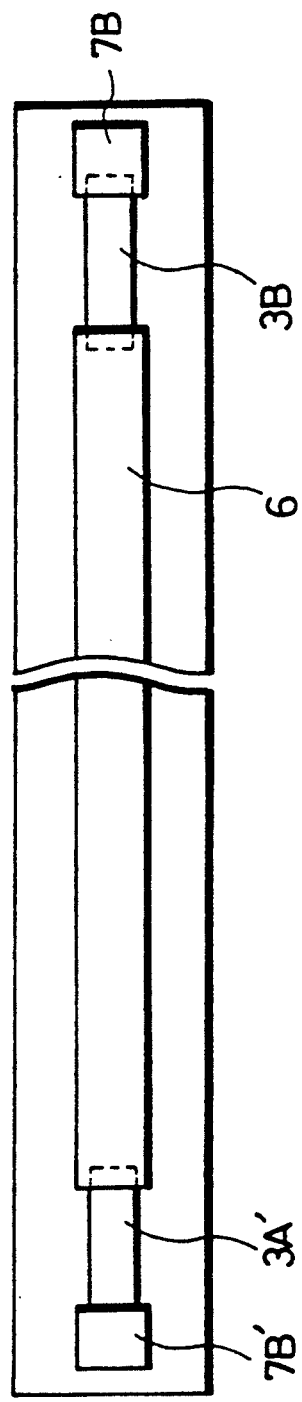

HEATER FOR SHEET MATERIAL

BACKGROUND OF THE INVENTION

1. Field of the Invention

This invention relates generally to heaters. More specifically, the present invention relates to a linear heater which can be advantageously used in an office automation apparatus such as a photocopier or electrophotographic printer for fixing images on a paper sheet for example.

2. Description of the Prior Art

Various types of linear heaters are known for fixing images (deposited toner) on a paper sheet in photocopiers or electrophotographic printers (e.g. laser beam printer). Typical examples include a lamp heater and a roller heater.

However, the lamp heater and roller heater are equally disadvantageous in that there is a limitation in reducing size (thickness) and cost. Further, the lamp heater is easily damaged due to the nature of material, whereas the roller heater has a complicated structure due to the necessity of incorporating plural heating elements within the roller.

To eliminate the problems of the conventional heaters, it has been proposed to use a strip heater for fixing images on a paper sheet in electrophotography. For the convenience of explanation, a typical arrangement of a prior art strip heater is shown in FIG. 14 of the accompanying drawings.

As shown in FIG. 14, the typical prior art strip heater comprises an elongate insulating substrate 100 having a surface formed with a printed resistor strip 101. Each end of the resistor strip 101 is connected to an enlarged terminal electrode 102 made of silver for connection to a power source (not shown). The resistor strip 101, which is made of e.g. silver-palladium alloy, generates heat when a current is passed therethrough.

Obviously, the prior art strip heater is very simple in arrangement. Further, the strip heater can be made very thin and light by reducing the thickness of the substrate 100. Moreover, the strip heater is also advantageous in that the time required for warming up is very short. However, the prior art strip heater still has the following problem.

Specifically, the enlarged terminal electrodes 102 made of silver are the portions where heat dissipation occurs most easily. Thus, when the resistor strip 101 is made to have a constant width over the entire length thereof, an uneven temperature distribution will result in which the surface temperature of the resistor strip is lower near the respective electrodes than at a central portion, as shown in FIG. 15. As a result, the heater will have an effective heating length A' which is non-negligibly smaller than the overall length A of the resistor strip 101. If the entire length A of the resistor strip 101 is utilized for heating, uneven image fixation will result. On the other hand, an attempt to increase the effective heating length A' will inevitably result in unacceptable elongation of the heater.

The above-described problem of the typical prior art strip heater can be solved by forming a resistor strip 101' which has a pair of end portions 101a' progressively reducing in width toward the respective electrodes 102, as shown in FIG. 16 and as taught in U.S. Pat. No. 5,068,517 to Tsuyuki et. al (Patented: Nov. 26, 1991; Filed: Aug. 22, 1989). However, such a solution gives rise to a new problem that the narrower end portions 101a' of the resistor strip 101' are more easily broken because, in spite of the reduced width, the narrower end portions 101a' generate a greater amount of heat than the central portion.

SUMMARY OF THE INVENTION

It is, therefore, an object of the present invention to provide a linear heater which is capable of uniformly heating a sheet material without increasing the likelihood of damaging a resistor strip.

According to the present invention, there is provided a heater for a sheet material comprising: an insulating substrate; and a main resistor strip formed on the substrate; wherein the substrate is further formed with auxiliary resistor strips adjacent to both ends of the main resistor strip, the main and auxiliary resistor strips being actuated simultaneously for heat generation.

In one embodiment of the present invention, the main and auxiliary resistor strips are formed on a same surface of the substrate. In such an embodiment, each of the auxiliary resistor strips may be electrically connected in series with the main resistor strip via a resistive connector portion which is integral with the main and auxiliary resistor strips. Alternatively, each of the auxiliary resistor strips may be electrically connected in series with the main resistor strip via a conductive connector portion.

Preferably, each of the auxiliary resistor strips is electrically connected, via a connecting hole internally formed with a conductive coating, to a conductor strip formed on another surface of the substrate opposite to the first-mentioned surface of the substrate, whereas the conductor strip is electrically connected to an electrode pad formed on said another surface of the substrate. In this case, it is advantageous if the connecting hole has an enlarged recess at one open end.

In another embodiment of the present invention, the main resistor strip is formed on a first surface of the substrate while the respective auxiliary resistor strips are formed on a second surface of the substrate opposite to the first surface of the substrate, the respective auxiliary resistor strips being connected in series with each other by a conductor strip formed on the second surface of the substrate. In such an embodiment, it is preferable that the respective auxiliary resistor strips and the conductor strip be linearly aligned with the main resistor strip.

In the latter embodiment, one end of the main resistor strip may be electrically connected to first electrode pad formed on the first surface of the substrate, the other end of the main resistor strip being electrically connected in series with one of the auxiliary resistor strips via a connecting hole which is internally formed with a conductive coating, the other of the auxiliary resistor strips being electrically connected to a second electrode pad formed on the second surface of the substrate. Alternatively, both ends of the main resistor strip may be electrically connected respectively to first and second electrode pads formed on the first surface of the substrate, one of the auxiliary resistor strips being electrically connected to a third electrode pad formed on the second surface of the substrate, the other of the auxiliary resistor strips being electrically connected to a fourth electrode pad formed on the second surface of the substrate.

Other objects, features and advantages of the present invention will become apparent from the following detailed description of the preferred embodiments given with reference to the accompanying drawings.

BRIEF DESCRIPTION OF THE DRAWINGS

In the accompanying drawings:

FIG. 10a is a plan view showing a heater according to a fourth embodiment of the present invention;

FIG. 10b is a bottom view showing the heater of FIG. 10a;

FIG. 11 is an enlarged fragmentary sectional view taken along lines XI—XI in FIG. 10a;

FIG. 12 is an enlarged fragmentary sectional view taken along lines XII—XII in FIG. 10a;

FIG. 13a is a plan view showing a heater according to a fifth embodiment of the present invention;

FIG. 13a is a bottom view showing the heater of FIG. 13a;

DETAILED DESCRIPTION OF THE PREFERRED EMBODIMENTS

Figure 1:
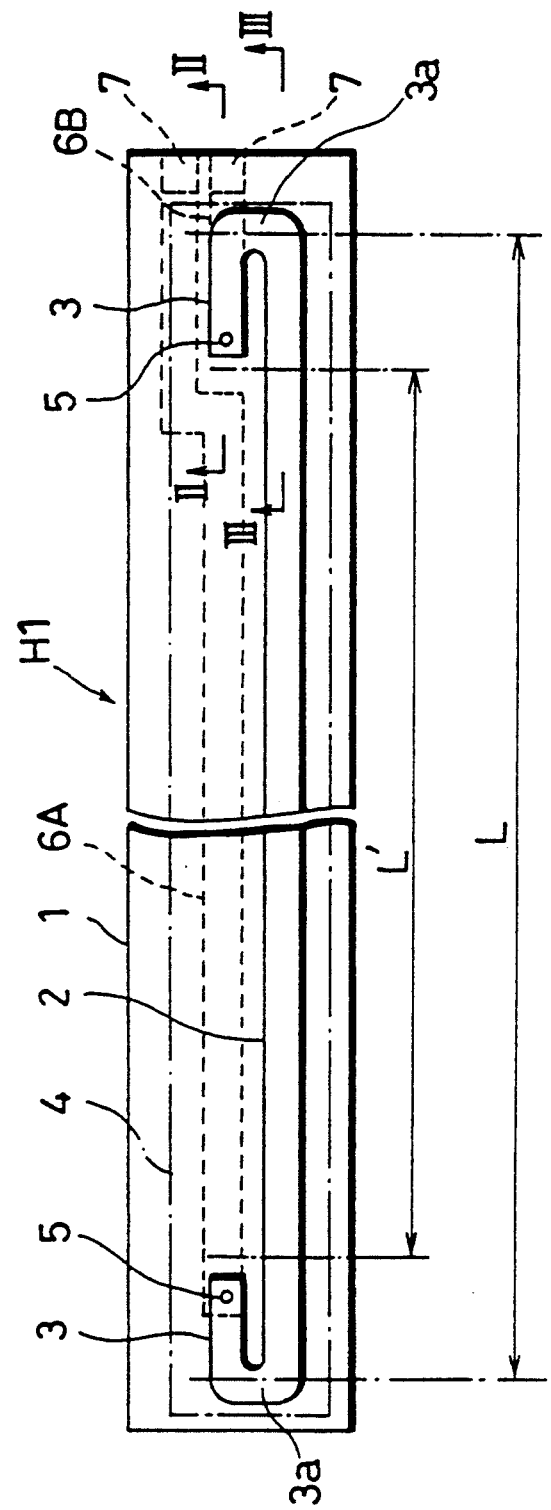
FIG. 1 is a plan view showing a heater according to a first embodiment of the present invention.

Preferred embodiments of the present invention are now described with reference to FIGS. 1 through 13b of the accompanying drawings. In these figures, like parts are designated by like reference numerals and characters.

EMBODIMENT 1

FIGS. 1–4 show a heater according to a first embodiment of the present invention.

Figure 2:
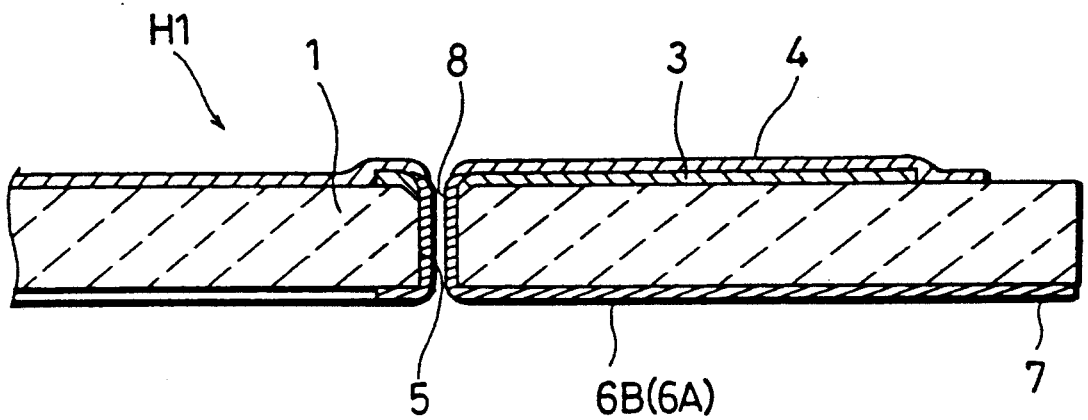
FIG. 2 is an enlarged fragmentary sectional view taken along lines II—II in FIG. 1.
Figure 3:
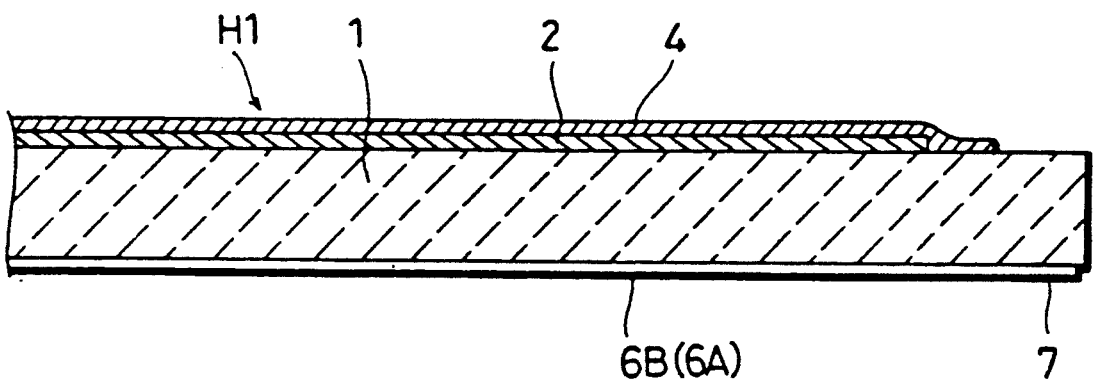
FIG. 3 is an enlarged fragmentary sectional view taken along lines III—III in FIG. 1.

Referring first to FIGS. 1 to 3, the heater H1 of this embodiment comprises an elongate substrate 1 made of a heat-resistant insulating material such as ceramic. The substrate 1 has a top surface formed with a main resistor strip 2 extending longitudinally of the substrate. The top surface of the substrate 1 further carries a pair of auxiliary resistor strips 3 extending in parallel to the main resistor strip 2 at both ends thereof. The auxiliary resistor strips 3 are electrically connected to the main resistor strip 2 respectively via resistive connector portions 3a integral with the respective resistor strips 2, 3. Thus, the auxiliary resistor strips 3 are in series with the main resistor strip 2.

The resistor strip 2 together with the auxiliar resistor strips 3 and the resistive connector portions 3a may be made by printing silver-palladium paste in a predetermined form and then baking the paste for fixation. Obviously, the respective resistor strips 2, 3 (including the resistive connector portions 3a) may be made of any other suitable resistor material such as ruthenium oxide.

A protective glass coating 4 covers the entirety of the respective resistor strips 2, 3. This glass coating provides smooth contact with a sheet material to be heated while protecting the respective resistor strips 2, 3.

On the other hand, the substrate 1 also has a bottom surface formed with a longer conductor strip 6A and a shorter conductor strip 6B. These conductor strips 6A, 6B terminate in respective electrode pads 7 formed at one end of the substrate 1. These electrode pads 7 are used for electrically connecting to respective power supply lines (not shown). The conductor strips 6A, 6B and the electrode pads 7 may be made together by printing a suitable conductor paste (e.g. silver, copper or gold) and then baking the printed paste for fixation.

The auxiliary resistor strips 3 are electrically connected to the respective conductor strips 6A, 6B via respective connecting holes 5 each of which is internally formed with a conductive coating 8, as schematically shown in FIG. 2. The conductive coating 8 may be made of baked silver paste for example.

As already described in connection with the prior art, heat dissipation is higher at both ends of the heater H1 than at the central portion of the heater, so that the temperature of the main resistor strip 2 is higher at its intermediate portion than at its end portions. However, when a voltage is applied across the respective electrode pads 7, not only the main resistor strip 2 but also the auxiliary resistor strips 3 and the resistive connector portion 3a generate heat to compensate for the uneven temperature distribution of the main resistor strip 2. Thus, the heater H1 provides an effective heating length L (FIG. 1) which is substantially equal to the length of the main resistor strip 2.

If no auxiliary resistor strips 3 are provided, the effective heating length of the heater H1 will reduce to L' which is considerably smaller than the length L of the main resistor strip 2. The length and width of the resistor strips 3 (and the connector portions 3a as well) may be suitably determined depending on various requirements which includes the rate of heat dissipation at both ends of the heater H1.

Figure 16:
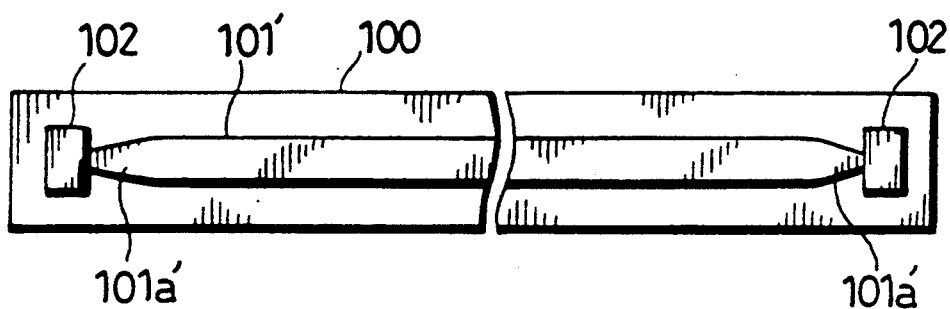
FIG. 16 is a plan view showing another prior art heater.

As described above, the heater H1 provides uniform longitudinal heating, namely, uniform image fixation when applied to electrophotographic printing, for a paper sheet (not shown). Nevertheless, the main resistor strip 2 may have a constant width over the entire length thereof. Thus, it is possible to prevent a reduction of service life which would occur when the resistor strip is made to have constricted end portions (see FIG. 16).

Further, the respective resistor strips 2, 3 (including the resistive connector portions 3a) can be formed simultaneously in a single process step. Thus, the additional provision of the auxiliary resistor strips 3 does not require any additional process step.

Moreover, both of the electrode pads 7 are provided on the bottom surface of the substrate 1, so that solder or other means for connecting the electrode pads 7 to the unillustrated power supply lines does not deteriorate the surface flatness of the heater H1 on the top surface side thereof. Thus, the heater can be brought into smooth contact with the unillustrated paper sheet.

Figure 4:
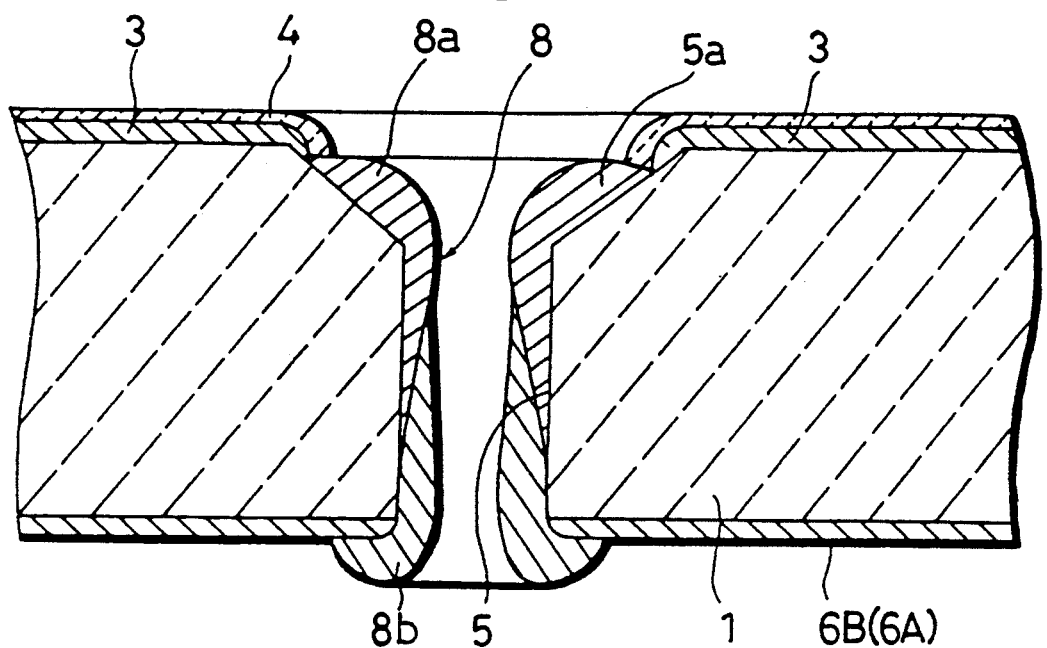
FIG. 4 is an enlarged fragmentary sectional view showing the structural details of a connecting hole for the heater of FIG. 1.

The structural details of each connecting hole 5 are shown in FIG. 4. Specifically, the connecting hole 5 is in the form of a countersunk bore having an enlarged recess 5a at its one open end closer to the top surface of the substrate 1. Preferably, the connecting hole 5 is formed before forming the respective resistor strips 2, 3 and the respective conductor strips 6a, 6b though it may be formed after the formation of these strips.

As also shown in FIG. 4, the conductive coating 8 comprises a first conductor layer 8a bulging into the enlarged recess 5a of the connecting hole 5, and a second conductor layer 8b bulging out of the connecting hole 5 on the bottom surface side of the substrate 1. The first conductor layer 8a is electrically connected to the corresponding auxiliary resistor strip 3. The second conductor layer 8b is overlapped on the first conductor layer 8a and electrically connected to the corresponding conductor strip 6B (or 6A). The conductive coating 8 having the double layer structure may be formed in the following manner.

First, the first conductor layer 8a is formed by supplying an amount of conductor paste from the bottom surface side of the connecting hole 5 while applying a suction force from the top surface side of the connecting hole 5. As a result, the conductor paste is drawn up along the inner wall of the connecting hole 5 to bulge into the enlarged recess 5a. The first conductor layer 8a is fixed in place by baking.

Then, the second conductor layer 8b is formed by supplying another amount of conductor paste from the top surface side of the connecting hole 5 while applying a suction force from the bottom surface side of the connecting hole 5. As a result, the conductor paste is drawn down along the inner wall of the fixed first conductor layer 8a (and the exposed inner wall of the connecting hole 5 as well) to bulge out of the connecting hole 5 on the bottom surface side of the substrate 1. The second conductor layer 8b is fixed in place by baking.

According to the arrangement shown in FIG. 4, the first conductor layer 8a of the conductive coating 8 bulges due to the application of a suction force at the time of forming that layer. However, the provision of the enlarged recess 5a prevents the first conductor layer 8a from bulging out of the connecting hole 5 on the top surface side of the substrate 1 because the bulge is received in the enlarged recess 5a. Thus, the top surface of the substrate 1 (namely, the heater H1) can come into smooth contact with an unillustrated paper sheet to be heated.

On the other hand, the second conductor layer 8b bulges abruptly out of the connecting hole 5 on the bottom surface side of the substrate 1. However, the bottom surface of the substrate is not used for contact with a paper sheet, so that the abrupt bulge of the second conductor layer 8b does not pose any problem. Obviously, if such a bulge is formed on the top surface side of the substrate 1 within the effective heating length L (see FIG. 1) of the heater H1, the paper sheet may be damaged during the heating operation.

Figure 5:
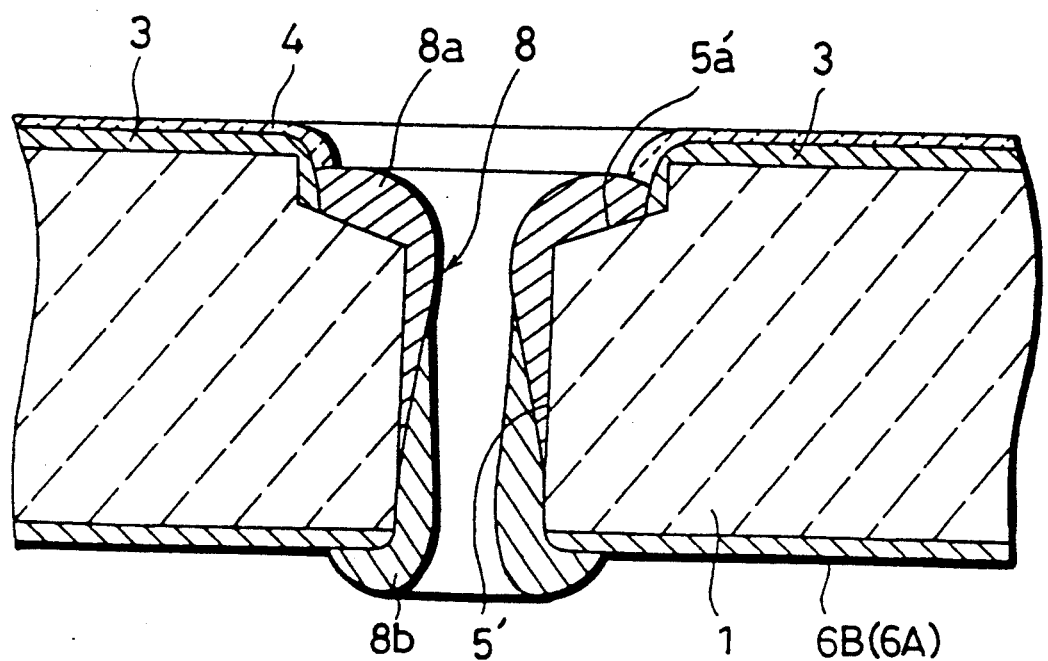
FIG. 5 is an enlarged fragmentary sectional view similar to FIG. 4 but showing the structural details of another connecting hole for the heater of FIG. 1.

The enlarged recess 5a shown in FIG. 4 is provided solely by a frustoconical surface. However, as shown in FIG. 5, the enlarged recess may be modified in configuration to have a stepped structure (indicated by reference sign 5a').

EMBODIMENT 2

Figure 6:
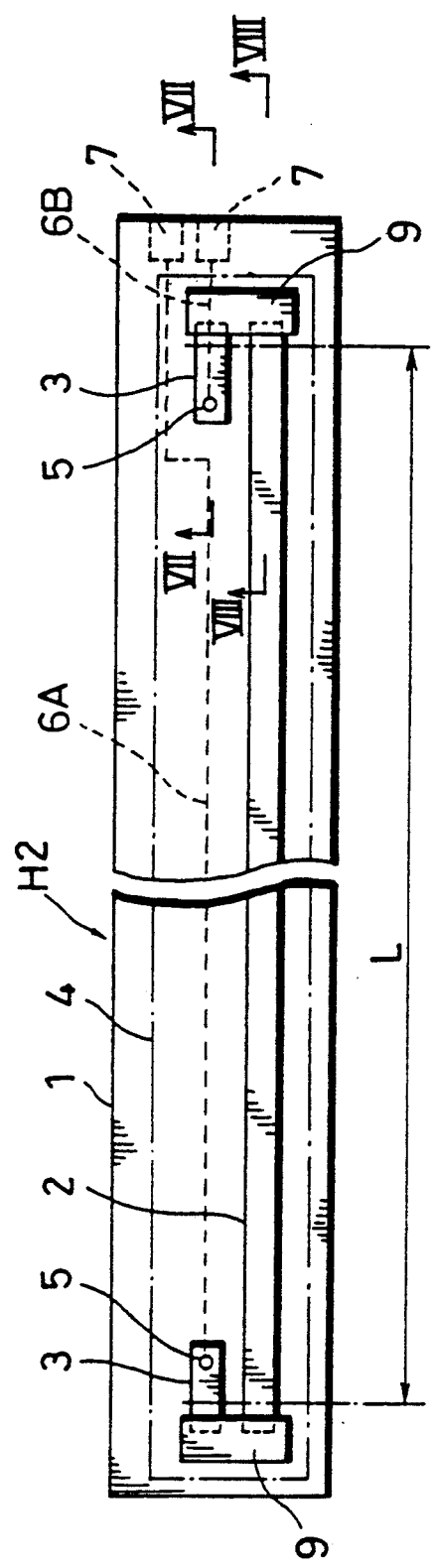
FIG. 6 is a plan view showing a heater according to a second embodiment of the present invention.
Figure 7:
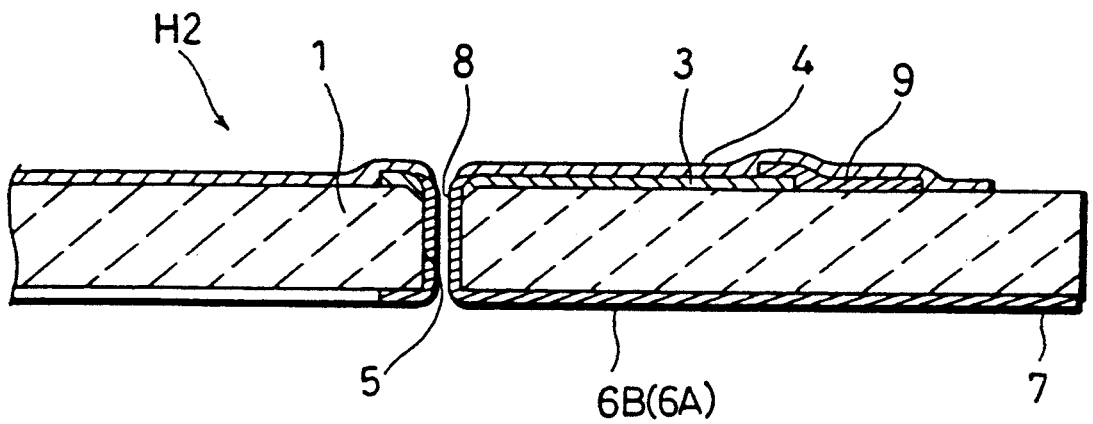
FIG. 7 is an enlarged fragmentary sectional view taken along lines VII—VII in FIG. 6.
Figure 8:
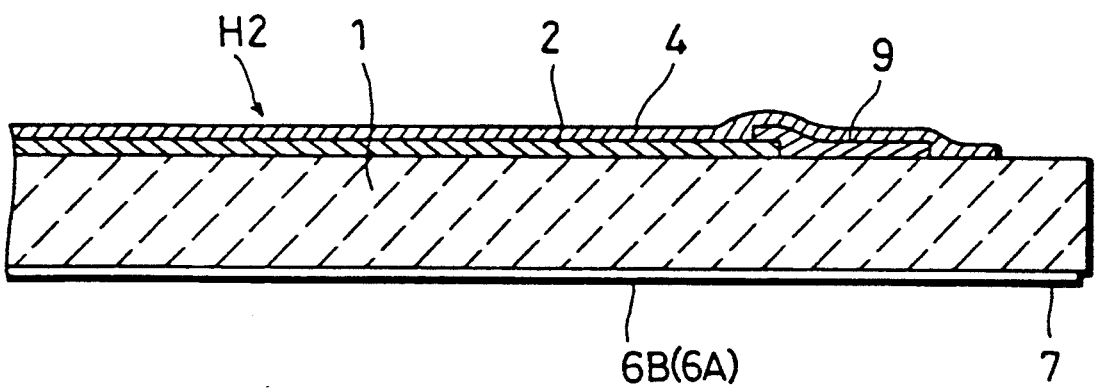
FIG. 8 is an enlarged fragmentary sectional view taken along lines VIII—VIII in FIG. 6.

FIGS. 6–8 show a heater according to a second embodiment of the present invention. The heater H2 of this embodiment is similar to that of the first embodiment but differs therefrom only in that a conductive connector portion 9, instead of the resistive connector portion 3a of the first embodiment, is formed to electrically connect between the main resistor strip 2 and each auxiliary resistor strip 3.

Obviously, each auxiliary resistor strip 3, which is electrically connected in series with the main resistor strip 2 through the conductive connector portion 9, provides additional heat generation to compensate higher heat dissipation at each end of the heater H2. As a result, the temperature distribution is equalized longitudinally within the effective heating length L (FIG. 6).

EMBODIMENT 3

Figure 9:
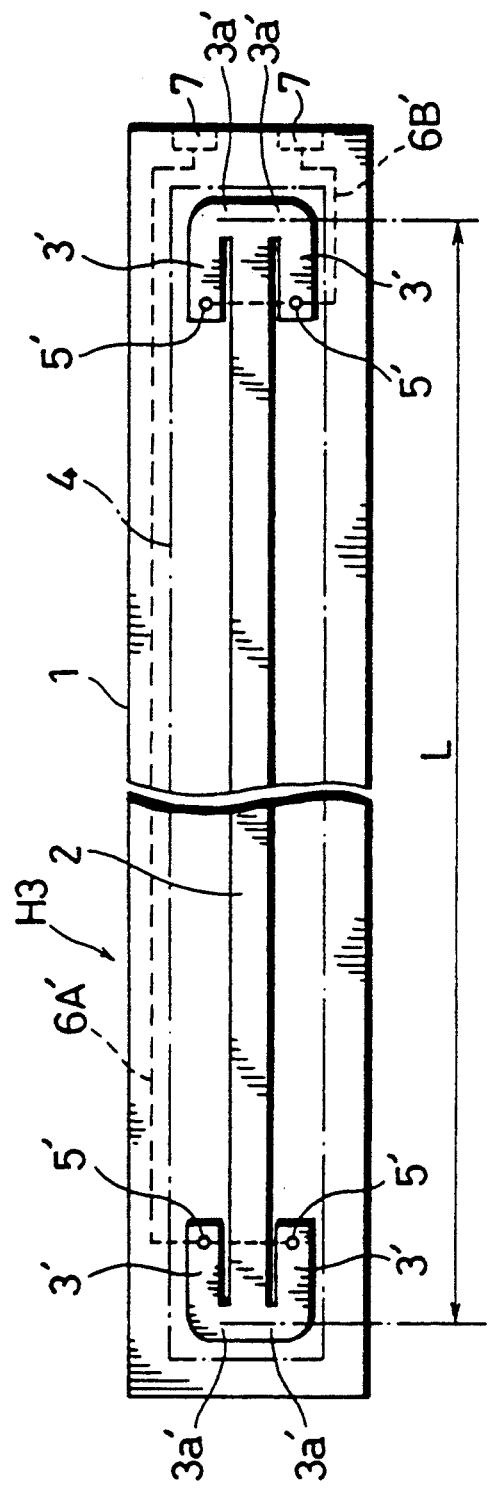
FIG. 9 is a plan view showing a heater according to a third embodiment of the present invention.
Figure 11:
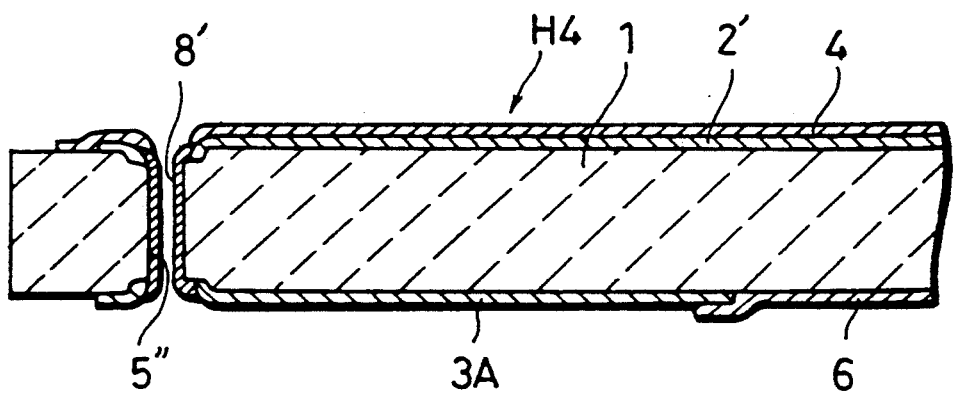
Figure 12:
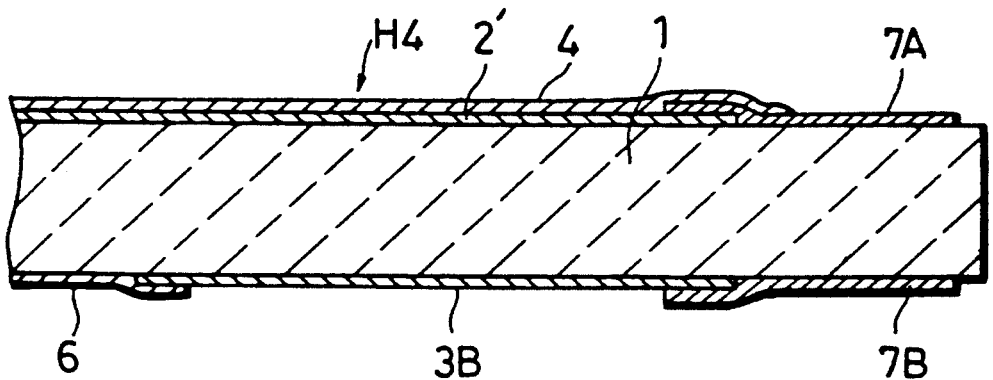
Figure 14:
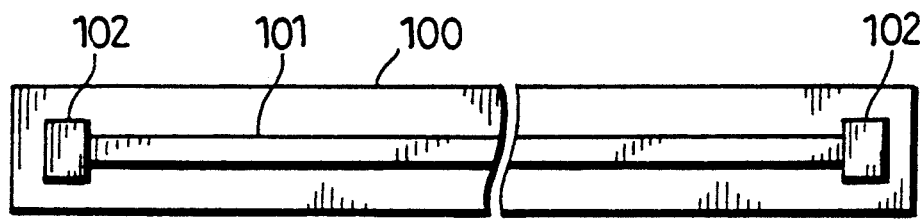
FIG. 14 is a plan view showing a prior art heater.
Figure 15:
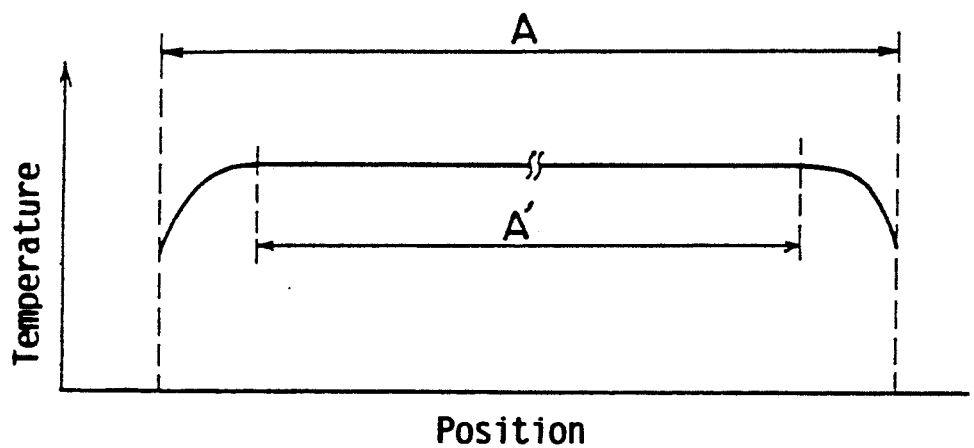
FIG. 15 is a graph showing the longitudinal temperature distribution obtainable by the prior art heater of FIG. 11.

FIG. 9 shows a heater according to a third embodiment of the present invention.

Similarly to the first embodiment, the heater H3 of the third embodiment comprises an elongate insulating substrate 1, a main resistor strip 2, and a protective glass coating 4. However, each end of the main resistor strip 2 is flanked by a parallel pair of auxiliary resistor strips 3' which are connected electrically in series with the main resistor strip 2 respectively via resistive connector portions 3a'.

The pair of auxiliary resistor strips 3' at one end of the substrate 1 are connected commonly, via respective connecting holes 5', to a conductor strip 6A' formed on the bottom surface of the substrate 1. Similarly, the pair of auxiliary resistor strips 3' at the other end of the substrate 1 are also connected commonly, via respective connecting holes 5', to another conductor strip 6B' formed on the bottom surface of the substrate 1. The respective conductor strips 6A', 6B' are electrically connected to respective electrode pads 7 which are, in turn, connected to respective power supply lines (not shown).

According to the third embodiment, the respective auxiliary resistor strips 3' in each pair are electrically parallel to each other due to common connection to corresponding one of the conductor strips 6A', 6B', but electrically in series with the main resistor strip 2. Obviously, the pair of auxiliary resistor strips 3' provides additional heat generation to acount for higher heat dissipation at each end of the heater H3.

EMBODIMENT 4

FIGS. 10a–12 show a heater according to a fourth embodiment of the present invention Similarly to the foregoing embodiments, the heater H4 of this embodiment comprises an elongate insulating substrate 1, a main resistor strip 2' formed on the top surface of the substrate 1, and a protective glass coating 4. However, the top surface of the substrate 1 is provided with no additional resistor strip.

Instead, the bottom surface of the substrate 1 is formed with a pair of auxiliary resistor strips 3A, 3B in corresponding relation to both ends of the main resistor strip 2'. A single conductor strip 6, which is also formed on the bottom surface of the substrate 1, connects electrically between the respective auxiliary resistor strips 3A, 3B.

One end of the main resistor strip 2' is electrically connected directly to an electrode pad 7A formed on the top surface of the substrate 1, whereas the other end of the main resistor strip 2' is electrically connected to one auxiliary resistor strip 3A via a connecting hole 5''. The other auxiliary resistor strip 3B is electrically connected to another electrode pad 7B provided in corresponding relation to the first-mentioned electrode pad 7A. Thus, the respective resistor strips 2', 3A, 3B are all connected in series.

Obviously, the respective auxiliary resistor strips 3A, 3B provide additional heat generation to compensate for higher heat dissipation at both ends of the heater H4. It should be appreciated that the insulating substrate 1 ca transmit heat
n to a certain degree, thereby enabling an intended temperature equalization.

Further, the auxiliary resistor strips 3A, 3B, which are formed on the bottom surface of the substrate 1, may be linearly aligned with the main resistor strip 2' on the top surface of the substrate 1. Thus, it is possible to minimize the width of the substrate 1.

EMBODIMENT 5

FIGS. 13a and 13b show a heater according to a fifth embodiment of the present invention.

Similarly to the fourth embodiment (FIGS. 10a–12), the heater H5 of this embodiment comprises an elongate insulating substrate 1, a main resistor strip 2" formed on the top surface of the substrate 1, and a protective glass coating 4. However, both ends of the main resistor strip 2" are electrically connected directly to first and second electrode pads 7A, 7A', respectively, which are also formed on the top surface of the substrate 1.

On the other hand, the bottom surface of the substrate 1 is formed with a pair of auxiliary resistor strips 3A', 3B in corresponding relation to both ends of the main resistor strip 2". A single conductor strip 6, which is also formed on the bottom surface of the substrate 1, connects electrically between the respective auxiliary resistor strips 3A', 3B.

One auxiliary resistor strip 3B is electrically connected to a third electrode pad 7B provided in corresponding relation to the first electrode pad 7A. Similarly, the other resistor strip 3A' is electrically connected to a fourth electrode pad 7B' provided in corresponding relation to the second electrode pads 7A'. Thus, the respective auxiliary resistor strips 3A', 3B are electrically independent from the main resistor strip 2".

The first and second electrode pads 7A, 7A' for the main resistor strip 2" are used for connection to a pair of power supply lines (not shown). Similarly, the third and fourth electrode pads 7B, 7B' are used for connection to another pair of power supply lines (not shown). In operation, the respective resistor strips 2", 3A', 3B are heated simultaneously, so that higher heat dissipation at both ends of the heater H5 is compensated for by the additional heat generated by the auxiliary resistor strips 3A', 3B.

The present invention being thus described, it is obvious that the same may be varied in many ways. For instance, any heater according to the present invention may be also used for heat-sealing a thermoplastic sheet in addition to image fixation. Such variations are not to be regarded as a departure from the spirit and scope of the the invention, and all such modifications as would be obvious to those skilled in the art are intended to be included within the scope of the following claims.

We claim:

1. A heater for a sheet material comprising:
an electrically insulating substrate; and
a main resistor strip formed on the substrate and having a heating length;
wherein the substrate is further formed with auxiliary resistor strips adjacent to both ends of the main resistor strip within the heating length thereof, the main and auxiliary resistor strips within the heating length being entirely actuated simultaneously for heat generation.

2. The heater according to claim 1, wherein the respective auxiliary strips are electrically connected in series with the main resistor strip.

3. The heater according to claim 2, wherein the main and auxiliary resistor strips are formed on a same surface of the substrate.

4. The heater according to claim 3, wherein each of the auxiliary resistor strips is electrically connected to the main resistor strip via a resistive connector portion which is integral with the main and auxiliary resistor strips.

5. The heater according to claim 3, wherein each of the auxiliary resistor strips is electrically connected to the main resistor strip via a conductive connector portion.

6. The heater according to claim 3, wherein each of the auxiliary resistor strips is electrically connected, via a connecting hole, to a conductor strip formed on another surface of the substrate opposite to the first-mentioned surface of the substrate, the connecting hole being internally formed with a conductive coating, the conductor strip being electrically connected to an electrode pad formed on said another surface of the substrate.

7. The heater according to claim 6, wherein the connecting hole has an enlarged recess at one open end.

8. The heater according to claim 1, wherein the main resistor strip is formed on a first surface of the substrate while the respective auxiliary resistor strips are formed on a second surface of the substrate opposite to the first surface of the substrate, the respective auxiliary resistor strips being connected to each other by a conductor strip formed on the second surface of the substrate.

9. The heater according to claim 8, wherein the respective auxiliary resistor strips and the conductor strip are linearly aligned with the main resistor strip.

10. The heater according to claim 8, wherein one end of the main resistor strip is electrically connected to a first electrode pad formed on the first surface of the substrate, the other end of the main resistor strip being electrically connected to one of the auxiliary resistor strips via a connecting hole which is internally formed with a conductive coating, the other of the auxiliary resistor strips being electrically connected to a second electrode pad formed on the second surface of the substrate.

11. The heater according to claim 8, wherein both ends of the main resistor strip are electrically connected respectively to first and second electrode pads formed on the first surface of the substrate, one of the auxiliary resistor strips being electrically connected to a third electrode pad formed on the second surface of the substrate, the other of the auxiliary resistor strips being electrically connected to a fourth electrode pad formed on the second surface of the substrate.

* * * * *